(12) United States Patent
Wiemer et al.

(10) Patent No.: US 6,863,832 B1
(45) Date of Patent: Mar. 8, 2005

(54) METHOD FOR PRODUCING A TORSION SPRING

(75) Inventors: Maik Wiemer, Limbach Oberfrohna (DE); Karla Hiller, Loessnitz (DE); Detlef Billep, Chemnitz (DE); Uwe Breng, Gundelfingen (DE); Bruno Rvrko, Reute (DE); Eberhard Handrich, Kirchzarten (DE)

(73) Assignee: LITEF GmbH, Freiburg im Breisgau (DE)

( * ) Notice: Subject to any disclaimer, the term of this patent is extended or adjusted under 35 U.S.C. 154(b) by 395 days.

(21) Appl. No.: 10/031,957
(22) PCT Filed: Jul. 20, 2000
(86) PCT No.: PCT/EP00/06957
§ 371 (c)(1), (2), (4) Date: Jun. 5, 2002
(87) PCT Pub. No.: WO01/07869
PCT Pub. Date: Feb. 1, 2001

(30) Foreign Application Priority Data

Jul. 21, 1999 (DE) ......................................... 199 34 174

(51) Int. Cl.$^7$ ................................................. C23F 1/00
(52) U.S. Cl. .......................................................... 216/2
(58) Field of Search ....................... 216/2, 24; 267/154; 73/504.12, 504.14

(56) References Cited

FOREIGN PATENT DOCUMENTS

| DE | 2818106 | | 12/1978 | | |
|---|---|---|---|---|---|
| DE | 2818106 A | * | 12/1978 | ............. | F16D/3/00 |
| DE | 4126100 | | 2/1993 | | |
| DE | 4126100 A1 | * | 2/1993 | ............. | G01L/3/10 |
| DE | WO 96/38710 | * | 12/1996 | ........... | G01C/19/56 |
| WO | 9638710 | | 12/1996 | | |

OTHER PUBLICATIONS

C. Kaufman et al., "Characterization of Material and Structure Defects on Micromechanical Scanners by Means of Frequency Analysis," *Proceedings of Micro Materials* (1995) p. 443 ff.

P. Enoksson et al., "A Silicon Resonant Sensor Structure for Coriolis Mass–Flow Measurements," *Journal of Micromechanical Systems*, vol. 6, No. 2, (Jun. 1997), pp. 119 through 125.

J. Choi et al., "Silicon Anagular Rate Sensor by Deep Reactive Ion Etching," *Proceedings of the Interantional Symposium on Microsystems, Intelligent Materials and Robots* (Sendai, Japan, 1995), pp. 29 through 32.

* cited by examiner

Primary Examiner—Gregory Mills
Assistant Examiner—Roberts Culbert
(74) Attorney, Agent, or Firm—Elliott N. Kramsky

(57) ABSTRACT

A method for producing a silicon torsion spring capable, for example, of reading the rotation rate in a microstructured torsion spring/mass system. The system that is produced achieves a low torsional stiffness compared to a relatively high transverse stiffness in the lateral and vertical directions. The method proceeds from a wafer or wafer composite and, upon suitable mask coverage, a spring with a V-shaped cross section is formed by anisotropic wet-chemical etching which preferably extends over the entire wafer thickness and is laterally delimited only by [111] planes. Two of the wafers or wafer composites prepared in this way are rotated through 180° and joined to one another oriented mirrorsymmetrically with respect to one another, so that overall the desired X-shaped cross section is formed.

3 Claims, 1 Drawing Sheet

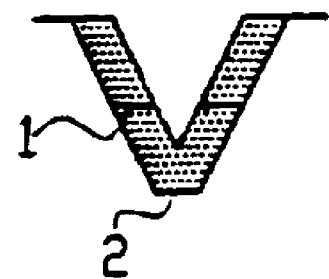 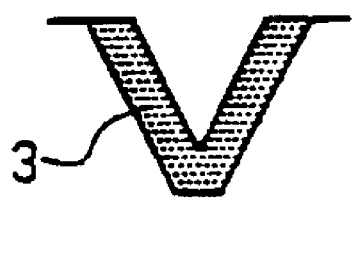
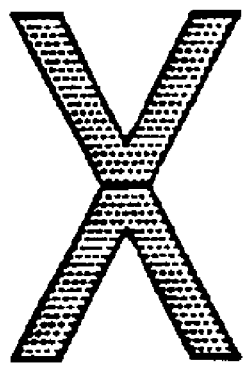 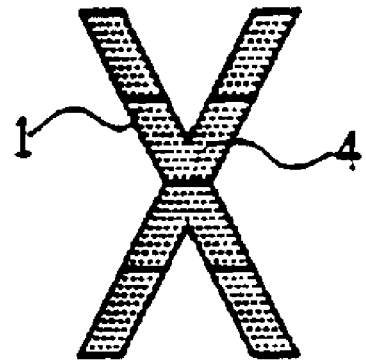
FIG. 1                FIG. 2

METHOD FOR PRODUCING A TORSION SPRING

BACKGROUND

1. Field of the Invention

The present invention relates to methods for producing a torsion spring for a micromechanical torsion spring/mass system. More particularly, the invention pertains to the production of a torsion spring from two wafers or wafer composites that possesses low torsional relative to transverse stiffness in the lateral and vertical directions.

2. Description of the Prior Art

Silicon torsion springs are known in various design variants in microstructuring. For example, C. Kaufman, J. Markert, T. Werner, T. Gessner and W. Dotzel in "Characterization of Material and Structure Defects on Micromechanical Scanners by Means of Frequency Analysis" *Proceedings of Micro Materials* (1995) p. 443, describe relatively long narrow strips, for example, for the articulated mounting of torsion mirrors. The spring cross section is of trapezoidal shape. Springs are formed on opposite wafer edges and produced by etching pits from the back surface during structuring of the springs from the front surface. J. Choi, K. Minami and M. Esahi in "Silicon Angular Rate Sensor by Deep Reactive Ion Etching," *Proceedings of the International Symposium on Microsystems, Intelligent Materials and Robots* (Sendai, Japan, 1995), pages 29 through 32, propose the production of a rectangular torsion cross section, in particular for suspending a tuning fork resonator, with a relatively high aspect ratio (height:width ratio $\geq 4$) by deep RIE (reactive ion etching). The two torsion spring cross sections have the disadvantage of sensitivity to transverse stresses. The spring cross-section produced by the first method is particularly sensitive to vertical bending, while the spring cross section produced by the second method is particularly sensitive to lateral bending.

German patent document DE 28 18 106 A1 discloses a torsion spring of cross-shaped cross-section that has low torsional compared to transverse rigidity in the lateral and vertical directions. A tube for a sensor that also acts as a torsion spring is disclosed by P. Enoksson et al. in "A Silicon Resonant Structure for Coriolis Mass-Flow Measurements," *Journal of Microelectromechanical Systems*, Vol. 6, No. 2 (June 1997) at pages 119 through 125. The tube is produced using the Coriolis principle, by turning wafers, placing them against one another in a mirror-symmetrical manner and bonding them, in each case with a trench formed therein.

In a further application of such torsion springs, rotary mirrors and micromechanical rotation rate sensors are mentioned in International patent publication WO 96/38710. In particular, FIG. 8 of that document illustrates a double-layer vibratory structure that is held in a frame by a cross-shaped spring joint formed from the wafer layers. This cross-shaped spring joint, which is formed from a total of four individual spring elements, improves stiffness in the wafer levels, a fact referred to in the patent publication. For a vibratory structure of this type, in which the vibrators, arranged in plate form above one another, form a micromechanical rotation rate sensor based on the Coriolis principle, it is desirable to optimize the cross-shaped spring joint in such a way that transverse stiffness relative to torsional stiffness is as high as possible in the direction of the wafer planes and perpendicular thereto (i.e. in the lateral and vertical directions).

SUMMARY AND OBJECTS OF THE INVENTION

It is therefore the object of the invention to provide a method for producing an optimized torsion spring for a micromechanical torsion spring/mass system.

The invention addresses the above object by providing a method for producing a torsion spring with low torsional compared to transverse stiffness in the lateral and vertical directions, as part of a micromechanical torsion spring/mass system from two wafers or wafer composites. Such method is begun by producing a spring extending over the entire thickness of the wafer or wafer composite by anisotropic wet chemical etching. The spring has a V-shaped cross section that is laterally delimited by [111] planes on at least one side edge region of each wafer or wafer composite.

The method then continues by rotating the two wafers or wafer composites through 180°. Finally, the two wafers or wafer composites are joined to one another, for example by bonding, while oriented with respect to one another in a mirror-image fashion so that an overall x-shaped torsion of the two V-shaped spring cross sections.

The foregoing and other features of the invention will become further apparent from the detailed description that follows. Such description is accompanied by a set of drawing figures. Numerals of the drawing figures, corresponding to those of the written description, point to the features of the invention with like numerals referring to like features throughout both the written description and the drawing figures.

BRIEF DESCRIPTION OF THE DRAWINGS

FIG. 1 illustrates a first method in accordance with the invention for producing a torsion spring with an X-shaped cross-section; and FIG. 2 illustrates a second method in accordance with the invention for producing a torsion spring with an X-shaped cross-section.

DETAILED DESCRIPTION OF THE PREFERRED EMBODIMENT

FIG. 1 illustrates a first method in accordance with the invention for producing a torsion spring with an X-shaped cross section from two wafers. In FIG. 1, the starting point for the method is two identical wafers, while in FIG. 2, which illustrates a second method in accordance with the invention, the starting point for the method is two wafer layer composites, separated or electrically insulated from one another along their common surface plane by an insulating layer 1. Strip-shaped etching masks 2 are applied in the lateral edge region of the wafers or the wafer composites. A spring 3 with a V-shaped cross section, which is laterally delimited by [111] planes, is then produced in the edge region of each wafer or wafer composite by anisotropic, wet-chemical etching. Two of the wafers or wafer composites which have been prepared with a V-shaped spring in this way are rotated through 180° with respect to one another and are then joined to one another oriented mirror image symmetrically with respect to one another. The joint process may be employed so that the desired transversely rigid torsion spring of X-shaped cross section is formed as a suspension element for a uniform torsion spring/mass system structure.

If the invention is used in combination with the production of micromechanical rotation rate sensors, the basis used (to be able to release different excitation potentials or reset signals, on the one hand, and feed and readout potentials, on the other hand, to the outside) is preferably a two-layered wafer composite for each of the plate-type oscillators. To be able to supply or remove four different electrical potentials by the crossed springs, it is advantageous for an insulating oxide to be formed on the surface of at least one of the wafers or the wafer composite that faces the other wafer or the other wafer composite during bonding.

The X-shaped, integrally joined torsion spring cross section formed by the method increases the ratio of transverse stiffness to torsional stiffness as opposed to a rectangular cross section and also as compared to individual crossed spring elements, as described in WO 96/38710, by more than two orders of magnitude.

A particular advantage of the method of the invention resides in its simple technology. The torsion spring is not affected by time-dependent etching processes. Only one etching step takes place that is critical in terms of time duration in the overall assembly of the two V-shaped springs.

The dimensional accuracy of the torsion spring, the masks of which obviously include long, narrow structures, is dependent, inter alia, upon precise matching of the crystal direction [110] to mask orientation. To insure precise orientation of the wafers with respect to one another and/or of wafers with respect to masks, the setting reference for the joint process, in particular silicon direct bonding, and the lithography is oriented in the [110] crystal direction using suitable chemical, plasma-chemical and/or mechanical means. This orientation may, for example, be affected by initially providing the wafers with an etching mask which is produced parallel to the ground bevel of a mask edge. The wafers are then anisotropically overetched using this mask, resulting in the formation of a new reference bevel, which then serves as an optical or mechanical (preferably gravity-assisted adjustment) reference for the joint process and the lithography, i.e. the mask orientation.

While this invention has been described with reference to its presently-preferred embodiment, it is not limited thereto. Rather, the invention is limited only insofar as it is described by the following set of patent claims and includes within its scope all equivalents thereof.

What is claimed is:

1. A method for producing a torsion spring with low torsional compared to transverse stiffness in the lateral and vertical directions as part of a micromechanical torsion spring/mass system, from two wafers or wafer composites, comprising the steps of:

a) producing a spring extending over the entire thickness of said wafer or wafer composite, said spring having a V-shaped cross section that is laterally delimited by [111] planes on at least one side edge region of each wafer or wafer composite, by anisotropic wet-chemical etching; then b) rotating said two wafers or wafer composites through 180°; and then c) joining said two wafers or wafer composites to one another oriented in a mirror-image fashion with respect to one another so that an overall X-shaped torsion spring crosssection is formed in the region of the two V-shaped spring cross sections.

2. A method as defined in claim 1, further including the step of forming an insulating layer on the surface that faces the other wafer or wafer composite during joint process on at least one wafer or wafer composite.

3. A method as defined in claim 2, characterized in that said two wafers or wafer composites are joined to one another by silicon direct bonding.

* * * * *